May 23, 1967 A. M. FRISCH ET AL 3,321,712

PHASE LOCK SYSTEM FOR SPECTRUM ANALYZER

Filed Aug. 16, 1965 2 Sheets-Sheet 1

ARNOLD M. FRISCH
GORDON D. LONG
INVENTORS
BY
BUCKHORN, BLORE, KLARQUIST & SPARKMAN
ATTORNEYS

ARNOLD M. FRISCH
GORDON D. LONG
INVENTORS

BY
BUCKHORN, BLORE, KLARQUIST & SPARKMAN
ATTORNEYS

United States Patent Office 3,321,712
Patented May 23, 1967

3,321,712
PHASE LOCK SYSTEM FOR SPECTRUM ANALYZER

Arnold M. Frisch, Portland, and Gordon D. Long, Beaverton, Oreg., assignors to Tektronix, Inc., Beaverton, Oreg., a corporation of Oregon Filed Aug. 16, 1965, Ser. No. 479,903
6 Claims. (Cl. 331—26)

The subject matter of the present invention relates generally to phase lock systems for synchronizing the frequency and phase of a free-running oscillator of high frequency with a harmonic of a stabilized reference oscillator of lower frequency, and in particular to a phase lock system for a local oscillator in a spectrum analyzer, such oscillator being adjustable in frequency over a wide range to heterodyne with the input signal applied to such analyzer.

Conventional spectrum analyzers with phase lock systems for the local oscillator connected to the mixer in the R.F. section at the input of such analyzer, have employed an additional mixer and low frequency oscillator in such phase lock system to convert the high frequency signal of the local oscillator into an intermediate frequency signal before transmitting such signal through an I.F. amplifier to a phase discriminator for comparison with the stabilized output signal of the reference oscillator at substantially the same frequency as such I.F. signal. A phase correction voltage is produced at the output of the phase discriminator which is fed back to the local oscillator to control its frequency and to phase lock or synchronize such local oscillator with such reference oscillator. The phase lock system of the present invention is simpler, more accurate and less expensive than the conventional system because it employs a phase discrimination circuit which enables the high frequency output signal of the local oscillator to be compared directly with the low frequency output signal of the reference oscillator in order to produce the phase correction signal. Thus the present phase lock system eliminates the additional mixer, low frequency oscillator and I.F. amplifier employed in conventional spectrum analyzers.

The above-mentioned advantages of the present invention are made possible by employing a pulse generator between the reference oscillator and the phase discriminator to produce narrow short rise time gating pulses having the same frequency as the reference oscillator but being of much narrower width than the high frequency signal of the local oscillator being stabilized, such gating pulse width being about 0.15 nanosecond typically. Only a portion of one cycle of the high frequency local oscillator signal is transmitted through a gate in such phase discriminator which is momentarily opened by such gating pulses to produce the phase correction signal. Since the gating pulse is always narrower than one cycle of the output signal of the local oscillator in spite of being of a lower frequency, the phase discriminator is operated efficiently to produce a phase correction signal of large amplitude regardless of the frequency setting of the local oscillator. This enables the local oscillator to be tuned over a wide range on the order of 1 megacycle per second to 2,000 megacycles per second. If the gating pulses were wide enough to enable several cycles of the high frequency sine wave output signal of the local oscillator to be transmitted through the discriminator gate, successive half-cycles of opposite polarity would cancel each other and reduce the amplitude of the phase correction signal, thereby preventing efficient operation.

A spectrum analyzer employing the phase lock system of the present invention in addition to being simpler and less expensive, is also more compact than previous analyzers using conventional phase lock systems, so that the present analyzer may be provided as a vertical plug-in unit for a cathode ray oscilloscope. In addition the present phase lock system requires fewer adjustments to synchronize the local oscillator over a wider frequency range. Furthermore, the present phase lock system employs a differential amplifier in the feedback path from the output of the phase discriminator to the control terminal of the local oscillator in order to produce a more accurate phase correction signal by comparing the output signal of the phase discriminator with a D.C. reference voltage to eliminate any error signal in the phase correction feedback signal. Also a transmission line type of phase inverter transformer is employed in the phase discriminator to transmit the gating pulses to the gate in order to improve the high frequency response of such discriminator.

It is therefore one object of the present invention to provide an improved phase lock system for a free-running oscillator whose frequency is tuned over a wide range, which is more accurate and less expensive by comparing the output signal of such oscillator directly with a stabilized reference signal of lower repetition frequency but of narrower width.

Another object of the present invention is to provide an improved phase lock system for a local oscillator in a spectrum analyzer, such system being simpler and more compact.

A further object of the invention is to provide an improved phase lock system for the local oscillator connected to the mixer in the input stage of a spectrum analyzer, which synchronizes the frequency and phase of such oscillator over a wide range of frequencies in a simple, efficient and reliable manner.

An additional object of the present invention is to provide an improved phase lock system for synchronizing a free-running oscillator over a wide frequency range up to very high frequencies on the order of 2,000 megacycles per second by directly comparing the sine wave output signal of such oscillator in a phase discriminator with the low frequency reference signal in the form of a narrow gating pulse having a pulse width less than one-half of a cycle of the sine wave signal to enable such discriminator to be operated efficiently to produce a phase correction signal of large magnitude.

Still another object of the present invention is to provide an improved phase lock system for the local oscillator connected to the input mixer of a spectrum analyzer in which a direct-coupled differential amplifier is employed in the feedback path from the output of a phase discriminator in such system to the frequency control terminal of such oscillator in order to provide a more accurate phase correction feedback signal.

A still further object of the present invention is to provide an improved gated phase discriminator circuit for comparing the phase and frequency of a high frequency input signal with a low frequency reference signal in the form of narrow gating pulses of short rise time in which a phase inverter transformer of better high frequency response formed by a pair of interconnected transmission lines is employed to transmit the gating pulses to a gate in such discriminator to prevent waveform distortion of such gating pulses.

Other objects and advantages of the present invention will be apparent from the following detailed description of a preferred embodiment thereof and from the attached drawings of which:

Figures 1, 2:
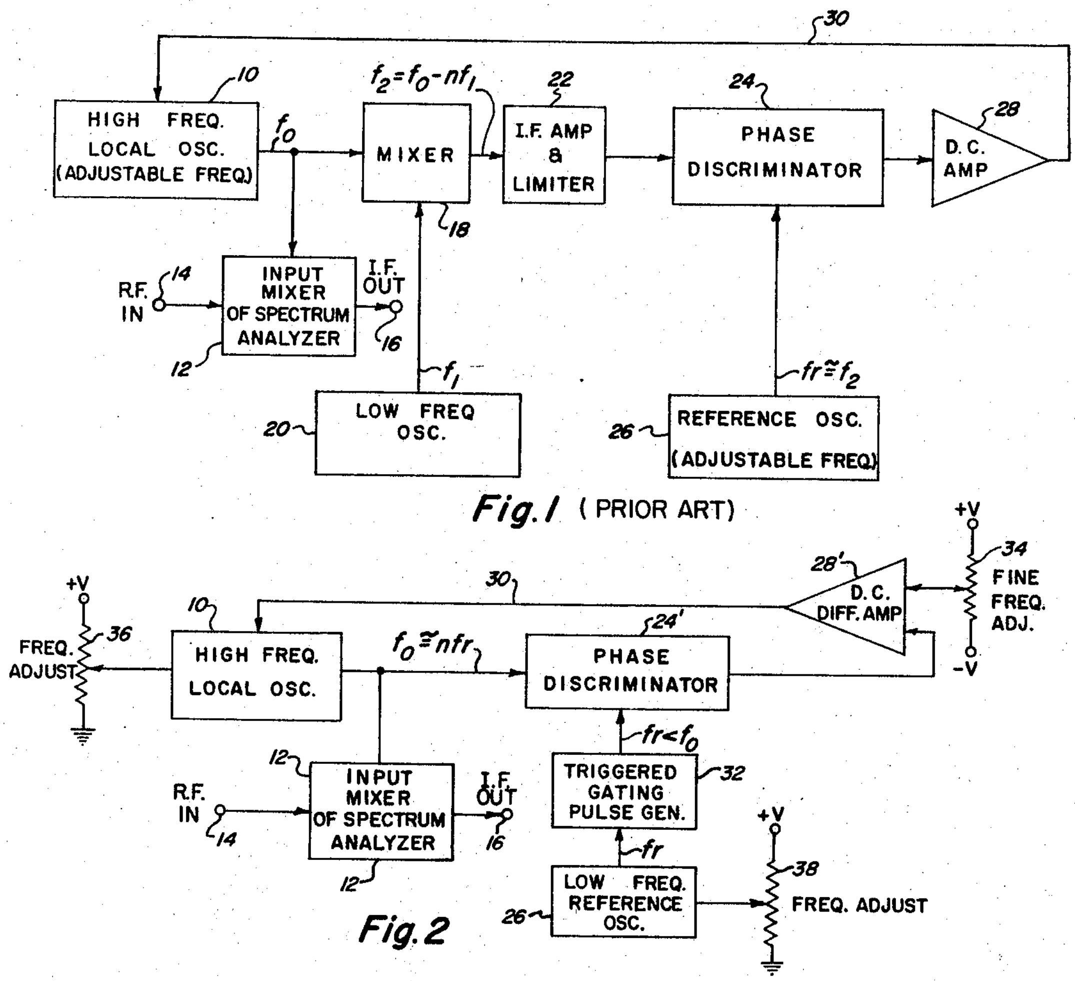
FIG. 1 is a block diagram of the conventional prior art phase lock system employed in previous spectrum analyzers.
FIG. 2 is a block diagram of the phase lock system employed in the spectrum analyzer of the present invention.

As shown in FIG. 1 the conventional phase lock system employed in previous spectrum analyzers includes a local oscillator 10 which is normally free-running and produces a sinusoidal output singal of high frequency $f_0$ which may be varied over a limited range. The output of the local oscillator 10 is connected to one input of a signal mixer 12 in the input stage of the spectrum analyzer whose other input is connected to the input terminal 14 of such analyzer to heterodyne the local oscillator signal with the radio frequency (R.F.) input signal applied to such input terminal in order to produce an intermediate frequency (I.F.) output signal at the output 16 of the mixer. In order to stabilize the local oscillator 10 and prevent changes in frequency and phase shift in the output signal of such oscillator, a portion of such output is transmitted to one input of a second mixer 18 in the conventional phase lock system. The other input of the second mixer is connected to a low frequency sine wave oscillator 20 which free-runs at a frequency $f_1$ much lower than the frequency $f_0$ of the local oscillator 10. Oscillator 20 is usually a stabilized crystal oscillator. As a result of the heterodyning operation performed by mixer 18, the output signal of such mixer has a frequency $f_2$ equal to $f_0-nf_1$ where $n$ is a whole number and $nf_1$ is a harmonic of the output signal of oscillator 20.

The output signal $f_2$ of mixer 18 is transmitted through an I.F. amplifier and limiter circuit 22 to one of the inputs of a phase discriminator circuit 24. The other input of the phase discriminator circiut is connected to the output of a reference oscillator 26 which is a free-running stabilized oscillator of adjustable frequency that produces a sine wave reference signal having a frequency $f_r$ which is approximately equal to the frequency $f_2$ of the output signal of mixer 18. Thus the phase discriminator 24 of the prior art system of FIG. 1 compares signals on a 1-to-1 frequency basis and produces a phase correction signal at its output when there is any phase shift in the output signal of the local oscillator 10. This phase correction signal is transmitted through a D.C. amplifier 28 and fed back to the frequency control input terminal of the local oscillator 10 through a feedback connection 30 to eliminate such phase shift. When the phase correction feedback signal has eliminated the phase shift in the mixer signal $f_2$, corresponding to the output signal of the local oscillator 10, with respect to the reference signal $f_r$ produced by oscillator 26, then the output signal of the phase discriminator 24 reduces to zero, ending any further phase correction.

As shown in FIG. 2 the phase lock system of the present invention employs many of the same elements shown in FIG. 1 and for this reason such similar elements have been given the same reference numerals. However it can be seen that the low frequency oscillator 20, the second mixer 18 and the I.F. amplifier and limiter circuit 22 of FIG. 1 have been eliminated in the phase lock system of the present invention. This has been made possible by the use of a different type of phase discriminator 24' shown in detail in FIG. 3, hereafter described, and by the connection of a triggered short pulse generator 32 between the output of the reference oscillator 26 and the reference signal input of such phase discriminator. The pulse generator 32 may be a monostable pulse generator which produces a narrow gating pulse of extremely short rise and fall times in response to the receipt of a trigger signal from the stabilized reference oscillator 26. These gating pulses have a frequency $f_r$ equal to that of the low frequency output signal of the reference oscillator but have a much narrower pulse width which is always less than one cycle of the high frequency output signal of local oscillator 10 for efficient operation over the entire frequency range of such local oscillator. Preferably the gating pulse produced by pulse generator 32 has a width less than one-half of one cycle of the sine wave signal produced by oscillator 10.

As indicated in FIG. 2, the reference gating pulse applied to the phase discriminator 24' by pulse generator 32 is a subharmonic of the desired frequency of the local oscillator 10. Thus the oscillator signal frequency $f_0$ is approximately equal to $nf_r$ where $n$ is some whole number. However, when the output signal of the local oscillator 10 differs in frequency or phase with respect to the reference signal produced by reference oscillator 26, the phase discriminator 24' produces an output signal which is transmitted through the direct-coupled amplifier 28' and the feedback connection 30 to the frequency control terminal of oscillator 10 to correct for such frequency difference or phase shift.

The D.C. amplifier 28' may be a differential amplifier having one input connected to the output of phase discriminator 24' and having its other input connected to the movable contact of a resistance potentiometer 34 which functions as a fine frequency tuning adjustment and error voltage elimination control. The end terminals of potentiometer 34 are connected to sources of positive and negative D.C. supply voltage labeled +V and −V, respectively, so that the output signal of the differential amplifier 28' corresponds to the difference between the D.C. voltage on the movable contact of potentiometer 34 and the output signal of the phase discriminator 24. As a result the phase correction feedback signal transmitted through conductor 30 to local oscillator 10 more nearly corresponds to the phase difference between the local oscillator signal and the nth harmonic of the reference oscillator signal.

It should be noted that the frequency of the local oscillator 10 is adjustable over a wide range between about 1 megacycle per second and 2,000 megacycles per second in the phase lock system of the present invention by any suitable means such as by adjustment of the movable contact of a potentiometer 36 connected between a source of positive D.C. supply voltage +V and ground. In addition, the reference oscillator 26 may also be tuned over a somewhat smaller range between about 100 kilocycles per second and 10 megacycles per second in a similar manner by a potentiometer 38 or other suitable frequency adjustment device.

From the above it can be seen that the phase lock system of the present invention is much simpler and more compact than that of the prior art. In addition the present phase lock system of FIG. 2 is only about one-tenth the cost of that of the prior art system of FIG. 1. In addition, by eliminating the low frequency oscillator 20 and mixer 18 used in the system of FIG. 1 the error in the phase correction feedback signal is reduced because such low frequency oscillator always has a small amount of instability even though it is crystal controlled. This error is further reduced by the differential amplifier 28' in the feedback circuit of the present system.

Figure 3:
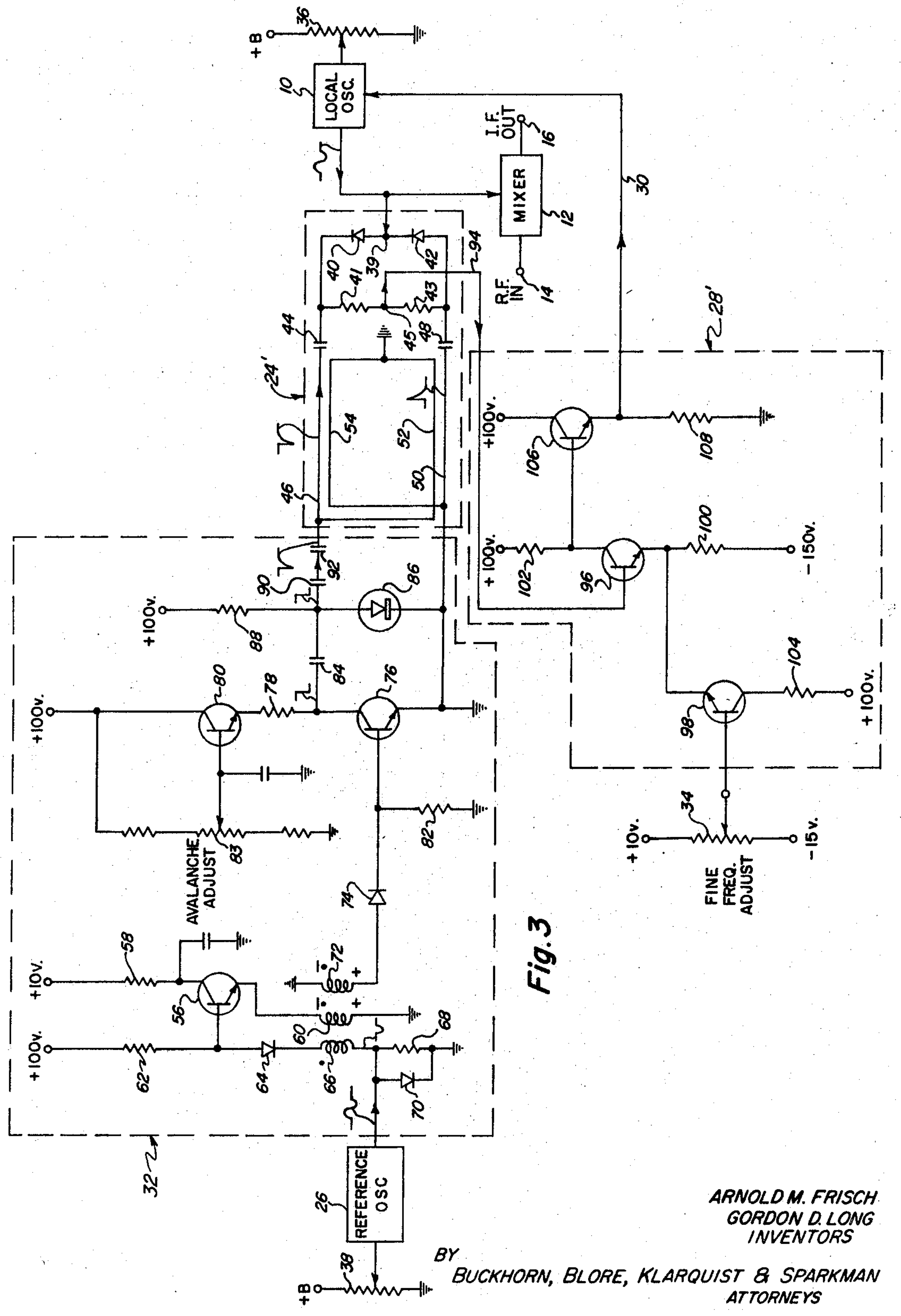
FIG. 3 is a schematic diagram of one embodiment of the electrical circuit of the phase lock system of FIG. 2.

As shown in FIG. 3, the phase discriminator 24' employed in the phase lock system of the present invention includes a pair of gating diodes 40 and 42 of the PN junction type which are connected of opposite polarity to the output of the oscillator 10 with the anode of diode 40 and the cathode of diode 42 connected together at an input terminal 39 of such discriminator. A pair of series-connected comparator resistors 41 and 43 of 1 kilohm each are connected across diodes 40 and 42, with the common connection of such resistors connected at the output terminal 45 of such discriminator. The cathode of diode 40 is connected through a coupling capacitor 44 of 20 picofarads to the signal conductor 46 of a first transmission line of the strip line type having a substantially uniform characteristic impedance. The anode of gating diode 42 is connected through a coupling capacitor 48 of 20 picofarads to the signal conductor 50 of a second transmission line similar to said first line. The signal conductor 46 of the first transmission line is connected to the grounded conductor 52 of the second transmission line at its input end, and in a similar manner the signal conductor 50 of the second transmission line is connected to the grounded conductor 54 of the first transmission line at its input. The outputs of conductors 52 and 54 are grounded. These transmission lines form a phase inverter transformer with signal conductor 46 providing a one-turn primary winding and signal conductor 50 providing a one-turn secondary winding for such transformer. The transmission line transformer transmits the narrow gating pulse from pulse generator 32 to the gating diodes 40 and 42 as a negative pulse and positive pulse, respectively, without any appreciable distortion, such gating pulses having a pulse width on the order of .15 nanosecond and rendering such diodes briefly conducting for a time corresponding to such pulse width.

The pulse generator 32 triggered by the reference oscillator 26 to produce the gating pulse for the phase discriminators 24′, includes a monostable blocking oscillator formed by a transistor 56 of the NPN type having its collector connected to a source of positive D.C. supply voltage of +10 volts through a resistor 58 of 220 ohms and its emitter connected to ground through the primary winding 60 of the transformer of such blocking oscillator. The base of transistor 56 is connected to a source of positive D.C. supply voltage of +100 volts through a resistor 62 of 22 kilohms and such base is also connected to ground through the series circuit of a diode 64, one secondary winding 66 of the blocking oscillator transformer and a bias resistor 68 of 51 ohms. Transistor 56 is quiescently biased conducting by the positive D.C. voltage drop across resistor 68. The sine wave output signal of the reference oscillator 26 is applied across resistor 68 and a diode 70 in parallel therewith to produce a negative half-cycle sine wave signal due to the rectifying action of such diode. The negative half-cycle signal is transmitted through diode 64 to the base of transistor 56 and tends to render such transistor nonconducting. As the emitter current decreases in transistor 56, a voltage is induced in the winding 60 of the polarity indicated, tending to oppose this decrease in current. The voltage produced across primary winding 60 also induces a voltage of similar polarity on the secondary winding 66 which rapidly reverse biases the emitter junction of transistor 56 so that such transistor is rendered nonconducting. At the same time a fast-rising positive voltage pulse is produced on the lower terminal of the output winding 72 of the blocking oscillator, since the upper terminal of such winding is grounded.

The transistor 56 of the blocking oscillator is automatically returned to its quiescent conducting state when the emitted current through winding 60 ceases because the voltage induced across the windings 60, 66 and 72 goes to zero. This enables the D.C. bias voltage across resistor 68 to render such transistor conducting. As the emitter current in winding 60 increases a voltage of opposite polarity to that indicated is induced across all of the transformer windings. However, the negative pulse produced on the lower terminal of the output winding is not transmitted through a coupling diode 74 connected between such winding and the base of an avalanche transistor 76 of the NPN type. Thus only the positive pulse produced across output winding 72 is transmitted to the base of the avalanche transistor and renders such transistor conducting from its quiescently nonconducting state.

The avalanche transistor 76 has its emitter grounded and its collector connected to a positive D.C. supply voltage of +100 volts through a load resistor 78 of 4 kilohms and the emitter-to-collector circuit of a transistor 80 of the NPN type in series with such resistor. The base of the avalanche transistor 76 is connected to ground through a bias resistor 82 of 51 ohms so that such transistor is normally biased nonconducting with a high D.C. reverse bias voltage applied across its collector. A resistance potentiometer 83 having its movable contact connected to the base of transistor 80 and its end terminals connected between the D.C. voltage source of +100 volts and ground, is employed to adjust the D.C. bias voltage applied to the collector of transistor 76 to set the avalanche level of such transistor.

When the positive voltage pulse produced by the blocking oscillator is applied to the base of such transistor it is rendered rapidly conducting by avalanche multiplication to produce a large negative-going voltage pulse of approximately 60 volts on its collector. This negative voltage pulse is transmitted through a coupling capacitor 84 of 20 picofarads to the anode of a snapoff diode 86 whose cathode is grounded and whose anode is connected to a positive D.C. voltage source of +100 volts through a load resistor 88 of 4.99 kilohms which quiescently biases such snapoff diode conducting. The snapoff diode 86 is rendered nonconducting by the negative-going voltage pulse transmitted from the collector of avalanche transistor 76 to produce a negative step voltage pulse of extremely short rise time on the anode of such diode. The snapoff diode is a PN junction semiconductor device designed to take advantage of the minority carrier charge stored in such diode when it is switched from a conducting to a nonconducting state. This charge is released very suddenly after a time delay to produce a large voltage pulse of extremely fast slope and negative polarity on its anode when the minority carriers are swept back into the PN junction during switching.

The anode of the snapoff diode is connected to the input of the signal conductor 46 of the transmission line transformer through a pair of series-connected coupling capacitors 90 and 92 of 15 picofarads each which differentiate the negative step voltage pulse to produce a negative spike-shaped gating pulse. This negative gating pulse is applied to the cathode of the gating diode 40, and induces a similar gating pulse but of positive polarity on the signal conductor 50 of the other transmission line which is applied to the anode of gating diode 42, to render such gating diodes simultaneously conducting. The gating diodes 40 and 42 are quiescently biased nonconducting by their internal self-bias voltage and by any voltage remaining on coupling capacitors 44 and 48 from the previous sample of the local oscillator signal. Thus diodes 40 and 42 are only rendered briefly conducting by the gating pulses transmitted from the snapoff diode 86, for a time determined by the width of such pulses which is about .15 nanosecond measured between the 50 percent amplitude points on the leading and trailing edges of such pulse.

When the high frequency local oscillator 10 is synchronized with the low frequency reference oscillator 26 the gating diodes 40 and 42 are rendered conducting when the sine wave output signal of such local oscillator crosses its neutral axis so that equal amounts of positive and negative signal current are transmitted respectively through diodes 40 and 42 to produce voltage drops of equal and opposite polarity across output resistors 41 and 43. As a result, the output votlage produced on the output terminal 45 of the phase discriminator is zero and no phase correction signal is transmitted through the feedback conductor 94 connected between such output terminal and one input of the differential amplifier 28′. However, if the high frequency oscillator 10 speeds up so that it is no longer in phase with the output signal of the reference oscillator 26, the gating diodes 40 and 42 are rendered conducting after the sine wave output signal of oscillator 10 has crossed the neutral axis or when the average value of the sine wave signal voltage transmitted through such gating diodes is positive. As a result diode 40 will conduct more current than diode 42, which will cause a greater voltage drop to occur across resistance 41 than across resistance 43, thereby producing an output signal on output terminal 45 whose voltage corresponds to the amount of phase shift between the local oscillator signal and the reference oscillator signal.

Thus, resistors 41 and 43 act as a voltage comparator in the phase discriminator to produce a difference signal output voltage when the portions of the oscillator signal transmitted through the gating diodes 40 and 42 are unequal in voltage amplitude. The operation of the gating diodes 40 and 42 and the output resistors 41 and 43 of the phase discriminator is like that of a bridge circuit so that as long as the diodes 40 and 42 remain equally conducting the bridge is balanced and there is no voltage difference between the input terminal 39 and the output terminal 45. However, if either diode 40 or 42 becomes more conductive than that of the other diode, the bridge becomes unbalanced and an output signal will be produced whose polarity depends upon which of the diodes conducts more than the other and whose voltage is determined by the magnitude of the difference in conductance or amount of current flowing through such diodes.

The phase discriminator circuit 24' employed in the phase lock system of the present invention has been used previously as an automatic frequency control in the horizontal sweep section of television receivers. However, the phase detector in the automatic frequency control system of the television receiver compares the horizontal sweep signal sawtooth output voltage of the horizontal sweep generator with the sync pulse of such receiver which is of the same frequency as such sawtooth signal. Thus the phase discriminator was not rendered conducting by a narrow gating pulse of a lower or subharmonic frequency than the horizontal sweep signal like the reference gating signal in the circuit of the present invention. Apparently one reason why this phase discriminator has never been used in a sepctrum analyzer is that its efficiency would ordinarily decrease as the frequency of the oscillator being stabilized increases when such oscillator is tuned to a different frequency. Of course varying the frequency of the local oscillator is necessary in a spectrum analyzer but does not occur in a television receiver whose horizontal oscillator is of a constant frequency. Thus the highest frequency oscillator signals would ordinarily be of less width than the low frequency reference gating signal so that several cycles of the sine wave oscillator signal would be transmitted through the discriminator gate for each gating signal. As a result successive positive and negative half-cycles of the sine wave would cancel each other out. This inefficient operation is avoided in the circuit of the present invention by providing an extremely narrow gating pulse as the low frequency reference signal, so that while the gating pulse is of a lower frequency than the oscillator signal of the high frequency local oscillator being stabilized, such gating pulse is always of a much narrower pulse width than one cycle of such oscillator signal regardless of its frequency.

The output terminal 45 of the phase discriminator 24' is connected through feedback conductor 94 to the base of a transistor 96 of the NPN type at the input of differential amplifier 28'. The other input of the differential amplifier is connected to the movable contact of the potentiometer 34 at the base of a second transistor 98 of NPN type whose emitter is connected to the emitter of transistor 96 and their common terminal connected to a negative D.C. voltage source of −150 volts through a load resistor 100 of 120 kilohms. The collectors of transistor 96 and 98 are connected through load resistors 102 and 104, respectively, of 100 kilohms each to positive D.C. supply voltages of +100 volts. The D.C. reference voltage applied to the base of transistor 98 is compared with the difference signal output voltage of the phase discriminator applied to the base of transistor 96 to reduce any error signal in such difference signal and to produce a more accurate phase correction feedback signal on the collector of transistor 96. Thus potentiometer 34 functions as a fine frequency adjustment to insure that the phase correction signal transmitted through the feedback conductor 30 to the frequency control terminal of the oscillator 10 is of the proper amplitude. It should be noted that the gating diodes 40 and 42 may not be perfectly matched and may have slightly different characteristics due to aging, etc., which is also corrected by the D.C. reference voltage applied to the differential amplifier.

An emitter follower transistor 106 of the NPN type may be provided between the output of transistor 96 and the frequency control terminal of the local oscillator. Thus the base of transistor 106 is connected to the collector of transistor 96 while its emitter is connected to ground through a load resistor 108 of 4.7 kilohms and its collector is connected to a source of positive D.C. supply voltage of +100 volts. The phase correction signal voltage is transmitted from the emitter of transistor 106 through the feedback conductor 30 to oscillator 10 to adjust the frequency of such oscillator while isolating the differential amplifier from the impedance of the local oscillator.

Figure 4:
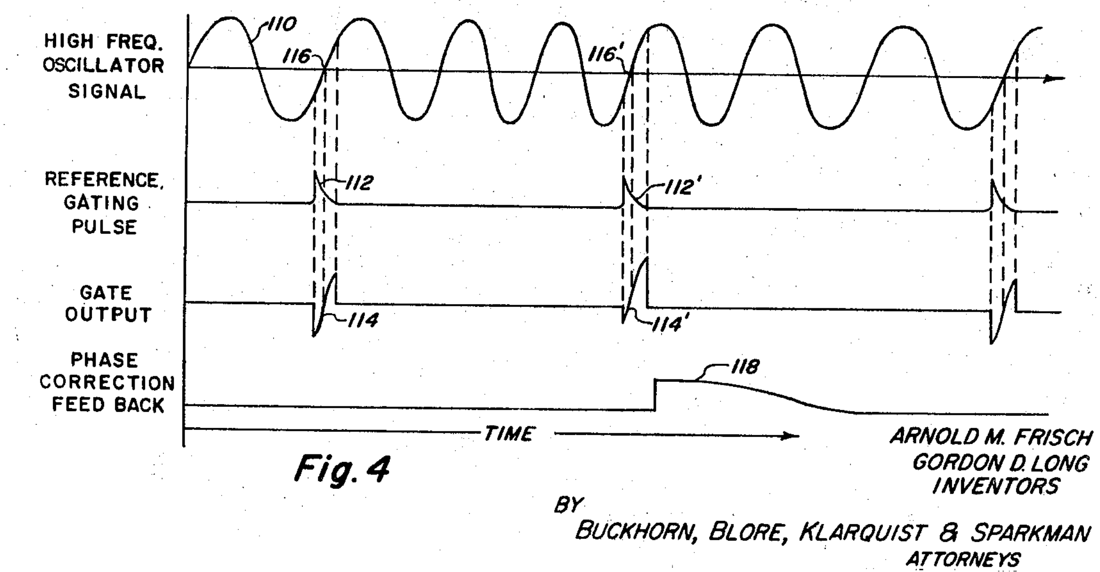
FIG. 4 shows the waveforms of some of the signals produced by the circuit of FIG. 3 in time relationship to one another.

In order to enable a clearer understanding of the operation of the phase lock system of FIGS. 2 and 3, the waveforms of some of the signals produced by such circuits are shown in FIG. 4 with a common time axis. Thus the output signal 110 of the high frequency local oscillator 10 is a sine wave which is sampled by the phase discriminator when a spike-shaped gating pulse 112 is generated by the gating pulse generator 32 and applied to the gating diodes 40 and 42 to render such diodes conducting. When the high frequency oscillator signal 110 is in phase with a harmonic of the reference gating pulse 112, the same portion 114 of the oscillator signal 110 transmitted through such gating diodes will be symmetrical about its neutral axis because the gating pulse 112 renders the diodes conducting for an equal amount of time on both sides of the neutral axis crossover point 116 of oscillator signal 110. However, when the high frequency oscillator signal 110 shifts in phase with respect to the reference gating pulse 112 to crossover point 116', an unsymmetrical sample portion 114' of such oscillator signal is transmitted to the output of the gate.

The phase shift sample 114' in the example given in FIG. 4 has an average voltage which is positive with respect to its neutral axis. As a result a positive voltage phase correction feedback signal 118 is produced at the output 45 of the phase discriminator which is fed back to the frequency control terminal of the local oscillator to return such oscillator to a synchronized condition with respect to the reference gating pulse. As the high frequency oscillator returns to a phase lock position, the phase correction signal 118 decreases to 0 and terminates.

It will be obvious to those having ordinary skill in the art that many changes may be made in the details of the above described preferred embodiment of the present invention. For example, a phase inverter tube or transistor may be employed in place of the phase inverter transformer in the phase discriminator, and at lower frequencies the gating pulses may be formed by switching transistors or means other than a snapoff diode. Therefore the scope of the present invention should only be determined by the following claims.

We claim:

1. A phase lock system for a spectrum analyzer comprising:

a high frequency oscillator normally free-running to produce a repetitive sine wave oscillator signal;

a signal mixer having one input connected to the input terminal of said spectrum analyzer and its other input connected to the output of said oscillator;

means for adjusting the frequency of said oscillator signal over a wide range;

phase discriminator means for determining whether said oscillator signal is of a predetermined frequency and phase, and including a normally nonconducting gate having its input connected to the output of said oscillator;

a low frequency pulse generator normally free-running to produce narrow gating pulses having a standard reference frequency which is lower than that of said oscillator signal and is a subharmonic of said predetermined frequency, said gating pulses having a pulse width which is less than the width of one-half cycle of said oscillator signal regardless of its frequency;

means connecting the output of said pulse generator to said gate to render said gate momentarily conducting for a time determined by the width of said gating pulse so that a portion of the oscillator signal is transmitted through said gate to the output of said discriminator as an output pulse having a width substantially equal to that of said gating pulse; and feedback means connected between the output of said phase discriminator means and a frequency control terminal of said oscillator for applying an unfiltered phase correction signal from said phase discriminator means to said oscillator in order to vary the frequency and phase of said oscillator to eliminate said phase shift in said oscillator signal.

2. A phase lock system for a spectrum analyzer comprising:

a high frequency signal oscillator normally free-running to produce a repetitive oscillator signal;

a signal mixer having one input connected to the input terminal of said spectrum analyzer and its other input connected to the output of said oscillator;

means for adjusting the frequency of said oscillator signal over a wide range;

phase discriminator means for determining whether said oscillator signal is of a predetermined frequency and phase, and including a pair of unilateral gating devices connected of opposite polarity to the output of said oscillator;

a stabilized low frequency pulse generator normally free-running to produce narrow gating pulses having a standard reference frequency which is lower than that of said oscillator signal and is a subharmonic of said predetermined frequency, said gating pulses being of said predetermined phase and having a pulse width which is less than the width of one half cycle of said oscillator signal regardless of its frequency;

phase splitter means connecting the output of said pulse generator to said phase discriminator means to apply gating pulses of opposite polarity to different ones of said gating devices to simultaneously render said gating devices momentarily conducting for a time determined by the width of said gating pulse so that a portion of the oscillator signal is transmitted through said gating devices as output pulses having a width substantially equal to that of said gating pulses;

said phase discriminator means including comparator means for comparing the output pulse transmitted through one of said gating devices with that transmitted through the other gating device to produce a difference signal at the output of said phase discriminator means whose magnitude corresponds to the amount of any phase shift of said oscillator signal with respect to said predetermined phase; and correction means connected between the output of said phase discriminator means and a frequency control terminal on said oscillator for applying an unfiltered phase correction signal to said oscillator corresponding to said difference signal in order to vary the frequency and phase of said oscillator to eliminate said phase shift in said oscillator signal.

3. In a spectrum analyzer, the improvement comprising a phase lock system including:

a signal mixer circuit having one input connected to the input terminal of said analyzer;

a high frequency signal oscillator normally free-running to produce a repetitive oscillator signal and having its output connected to the other input of said mixer;

means for varying the frequency of said oscillator signal over a wide range;

phase discriminator means for determining whether said oscillator signal is of a predetermined frequency and phase, and including a normally nonconducting gate having its input connected to the output of said signal oscillator;

a lower frequency pulse generator normally free-running to produce narrow gating pulses having a standard reference frequency which is lower than that of said oscillator signal and is a subharmonic of said predetermined frequency, said gating pulses having a pulse width which is less than the width of one cycle of said oscillator signal;

means for adjusting the frequency of said gating signal;

means connecting the output of said pulse generator to said gate to render said gate momentarily conducting for a time determined by the width of said gating pulse so that a portion of the oscillator signal of said oscillator is transmitted through said gate to the output of said discriminator as an output pulse having a width substantially equal to that of said gating pulse; and feedback means connected to transmit a phase correction signal from the output of said phase discriminator means to a frequency control terminal of said oscillator in order to vary the frequency and phase of said oscillator in response to said phase correction signal to eliminate said phase shift in said oscillator signal, said feedback means including a differential amplifier having one input connected to said phase discriminator means and its other input connected to an adjustable D.C. reference voltage and having its output connected to said frequency control terminal.

4. A phase lock system for a spectrum analyzer, comprising:

a signal mixer circuit having one input connected to the input terminal of said analyzer;

a high frequency signal oscillator normally free-running to produce a repetitive sine wave oscillator signal and having its output connected to another input of said mixer circuit;

phase discriminator means for determining whether said oscillator signal is of a predetermined frequency and phase, and including a pair of unilateral gating devices connected of opposite polarity to the output of said oscillator;

a low frequency pulse generator normally free-running to produce narrow gating pulses having a standard reference frequency which is lower than that of said oscillator signal and is a subharmonic of said predetermined frequency, said gating pulses being of said predetermined phase and having a pulse width which is less than the width of one-half cycle of said oscillator signal regardless of its frequency;

inverter means including a pair of transmission lines of substantially the same uniform characteristic impedance connected together to form a phase splitter transformer, for connecting the output of said pulse generator to said phase discriminator means to apply gating pulses of opposite polarity to different ones of said gating devices to simultaneously render said gating devices momentarily conducting for a time determined by the width of said gating pulse so that a portion of the oscillator signal is transmitted through said gating devices;

said phase discriminator means including comparator means for comparing the amount of oscillator signal transmitted through one of said gating devices with that transmitted through the other gating device to produce a difference signal at the output of said phase discriminator means whose magnitude corresponds to the amount of any phase shift of said oscillator signal with respect to said predetermined phase; and correction means connected between the output of said phase discriminator means and a frequency control terminal on said oscillator in order to vary the frequency and phase of said oscillator in response to said difference signal to eliminate said phase shift in said input signal.

5. A phase lock system for a spectrum analyzer, comprising:

a high frequency signal oscillator normally free-running to produce a repetitive oscillator signal;

means for adjusting the frequency of said oscillator over a wide range;

phase discriminator means for determining whether said oscillator signal is of a predetermined frequency and phase, and including a pair of gating diodes connected of opposite polarity to the output of said oscillator;

a low frequency pulse generator normally free-running to produce narrow gating pulses having a standard reference frequency which is lower than that of said oscillator signal and is a subharmonic of said predetermined frequency, said gating pulses being of said predetermined phase and having a pulse width which is less than the width of one cycle of said oscillator signal;

means for adjusting the frequency of said gating pulses;

inverter means connecting the output of said pulse generator to said phase discriminator means to apply gating pulses of opposite polarity to different ones of said diodes to simultaneously render said diodes momentarily conducting for a time determined by the width of said gating pulse so that a portion of the oscillator signal of said oscillator is transmitted through said diodes;

said phase discriminator means including a pair of resistors connected between the output terminal of said discriminator and the outputs of different ones of said diodes for comparing the amount of input signal transmitted through one of said diodes with that transmitted through the other diode to produce a phase correction signal at the output of said phase discriminator means whose magnitude corresponds to the amount of any phase shift of said input signal with respect to said predetermined phase; and feedback means including a direct coupled differential amplifier having one input connected to the output of said phase discriminator means, its other input connected to a source of error compensation voltage and its output connected to a frequency control terminal on said oscillator in order to vary the frequency and phase of said oscillator in response to a difference signal corresponding to the difference in voltage between said error compensation voltage and said phase correction signal, to eliminate said phase shift in said input signal.

6. A phase discriminator circuit, comprising:

a pair of gating diodes connected of opposite polarity as an input terminal of said discriminator circuit;

an inverter transformer including a pair of transmission lines each having two conductors with the output of one of said conductors connected to one of said diodes to function as a signal conductor and the output of the other conductor grounded, the grounded output conductor of each of said lines having its input connected to the input of the signal conductor of the other of said lines, and one of said signal conductors having its input connected as another input terminal of said discriminator circuit;

a pair of capacitors each connected between the output of a different one of said signal conductors and said diodes; and a pair of resistors connected in series across said pair of diodes and having their common terminal connected as the output terminal of said discriminator circuit.

References Cited by the Examiner

UNITED STATES PATENTS

| | | | |
|---|---|---|---|
| 2,930,001 | 3/1960 | Salmet | 331—19 |
| 3,260,959 | 7/1966 | Broadhead | 331—26 |

ROY LAKE, *Primary Examiner.*

S. H. GRIMM, *Assistant Examiner.*